(12) United States Patent
Hung et al.

(10) Patent No.: US 8,000,131 B2
(45) Date of Patent: Aug. 16, 2011

(54) NON-VOLATILE FIELD PROGRAMMABLE GATE ARRAY

(75) Inventors: Chih-Wei Hung, Hsin-Chu (TW); Chia-Ta Hsieh, Tainan (TW); Luan C. Tran, Shin-Shih Township, Tainan County (TW)

(73) Assignee: Taiwan Semiconductor Manufacturing Company, Ltd, Hsin-Chu (TW)

(*) Notice: Subject to any disclaimer, the term of this patent is extended or adjusted under 35 U.S.C. 154(b) by 72 days.

(21) Appl. No.: 12/432,214

(22) Filed: Apr. 29, 2009

(65) Prior Publication Data

US 2010/0277986 A1    Nov. 4, 2010

(51) Int. Cl.
*G11C 11/00*    (2006.01)

(52) U.S. Cl. .................. 365/156; 365/185.33; 365/154; 365/63

(58) Field of Classification Search .................. 365/63, 365/154, 156, 185.33
See application file for complete search history.

(56) References Cited

U.S. PATENT DOCUMENTS

| | | | | |
|---|---|---|---|---|
| 5,439,840 A * | 8/1995 | Jones et al. | .................. | 438/3 |
| 5,517,186 A * | 5/1996 | Veenstra | .................. | 326/39 |
| 5,623,440 A * | 4/1997 | Saito | .................. | 365/149 |
| 5,646,901 A * | 7/1997 | Sharpe-Geisler et al. | .... | 365/218 |
| 5,706,226 A * | 1/1998 | Chan et al. | .................. | 365/156 |
| 5,757,713 A * | 5/1998 | Gans et al. | .................. | 365/226 |
| 5,807,786 A | 9/1998 | Chang | | |
| 5,831,897 A * | 11/1998 | Hodges | .................. | 365/156 |
| 5,936,426 A * | 8/1999 | Wilson et al. | .................. | 326/49 |
| 6,265,257 B1 | 7/2001 | Hsu et al. | | |
| 6,717,839 B1 * | 4/2004 | Du | .................. | 365/145 |
| 6,773,967 B1 | 8/2004 | Liu | | |
| 6,845,035 B2 * | 1/2005 | Ooishi | .................. | 365/149 |
| 7,046,565 B1 * | 5/2006 | Barth et al. | .................. | 365/203 |
| 7,294,888 B1 * | 11/2007 | Paak et al. | .................. | 257/369 |
| 7,350,177 B2 | 3/2008 | Chung et al. | | |
| 7,359,272 B2 | 4/2008 | Wang et al. | | |
| 7,626,423 B1 * | 12/2009 | Li et al. | .................. | 326/86 |
| 7,643,329 B2 * | 1/2010 | Sachdev et al. | .................. | 365/154 |
| 7,804,702 B2 * | 9/2010 | Madan | .................. | 365/145 |
| 2008/0253180 A1 * | 10/2008 | Nicolaidis et al. | .................. | 365/181 |

* cited by examiner

*Primary Examiner* — Viet Q Nguyen
(74) *Attorney, Agent, or Firm* — Haynes and Boone, LLP

(57) ABSTRACT

A non-volatile memory device includes a first metal-oxide-semiconductor (CMOS) device coupled to a bit line and a word line and a second CMOS device coupled to the first CMOS device. The second CMOS device is also coupled to a complementary bit line and a complementary word line. The first and second CMOS devices are complementary to one another. An output node is coupled between the first CMOS device and the second CMOS device. A method of programming a non-volatile field programmable gate array (NV-FPGA) includes coupling an information handling system to the FPGA, performing a block erase of a plurality of memory cells in the FPGA, verifying that the block erase is successful, programming an upper page of the FPGA, verifying that the upper page programming is successful, programming a lower page of the FPGA and verifying that the lower page programming is successful.

12 Claims, 4 Drawing Sheets

NON-VOLATILE FIELD PROGRAMMABLE GATE ARRAY

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also increased the complexity of processing and manufacturing ICs and, for these advances to be realized, similar developments in IC processing and manufacturing are needed.

One particular IC device is known as a field-programmable gate array (FPGA). An FPGA is a gate device that can be configured and manufactured to perform in a given manner. Conventional FPGAs are traditionally manufactured having static random access memory (SRAM) for data storage. SRAM does not need to be refreshed to maintain the data while in operation; however, if the SRAM is powered down or otherwise loses power, SRAM is volatile memory and will lose data stored in the SRAM. The SRAM code is generally loaded from external flash memory devices. Thus, if one desires to change a programmed logic function of the FPGA, the logic function must be changed by modifying the SRAM code. As such, the data will be lost once the device is powered down. In addition, the SRAM is large and takes up valuable device space. Furthermore, the device cost is high due to the device requiring the main IC plus the flash memory device.

Accordingly, what is needed is an integrated circuit device that addresses the above stated issues, and a method for using the same.

SUMMARY

Embodiments of the present disclosure relate to a non-volatile memory device and include a first metal-oxide-semiconductor (CMOS) device coupled to a bit line and a word line and a second CMOS device coupled to the first CMOS device. The second CMOS device is also coupled to a complementary bit line and a complementary word line. The first and second CMOS devices are complementary to one another. An output node is coupled between the first CMOS device and the second CMOS device.

In an embodiment, a method for programming a non-volatile field programmable gate array (NV-FPGA) includes coupling an information handling system to the FPGA, performing a block erase of a plurality of memory cells in the FPGA, verifying that the block erase is successful, programming an upper page of the FPGA, verifying that the upper page programming is successful, programming a lower page of the FPGA and verifying that the lower page programming is successful.

The above and other features will be better understood from the following detailed description of the present embodiments of the disclosure that is provided in connection with the accompanying drawings.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

Following are brief descriptions of exemplary drawings. They are mere exemplary embodiments and the scope of the present disclosure should not be limited thereto.

DETAILED DESCRIPTION

Figure 1:
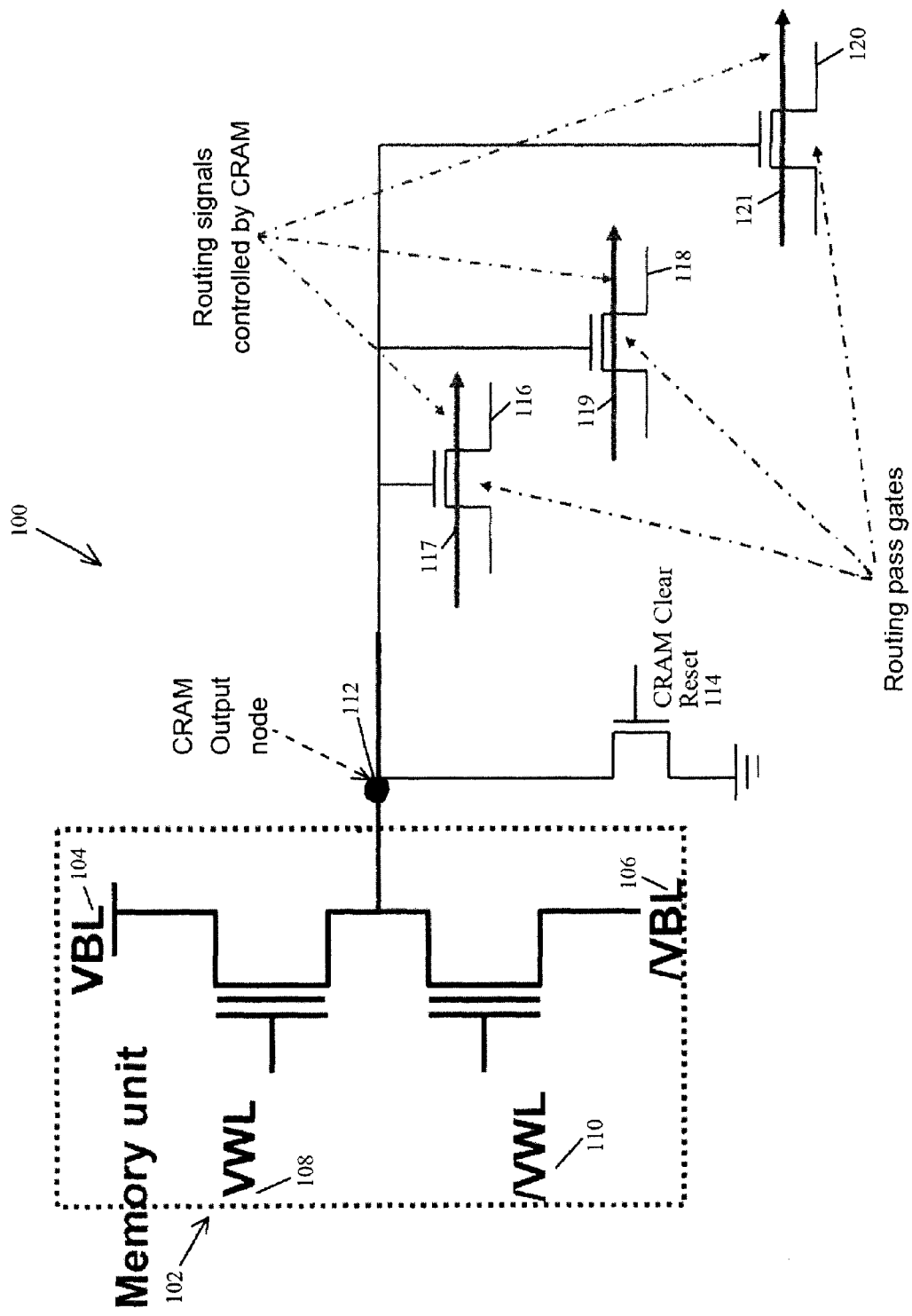
FIG. 1 illustrates a schematic view of an embodiment of an integrated circuit device according to aspects of the present embodiments.

The present disclosure relates to an integrated circuit (IC) device, and more particularly to non-volatile field programmable gate array (NV-FPGA) IC and method of programming the same.

This description of the exemplary embodiments is intended to be read in connection with the accompanying drawings, which are to be considered part of the entire written description. In the description, relative terms such as "lower," "upper," "horizontal," "vertical,""above," "below," "up," "down," "top," and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

It is understood that the following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure relate to IC design and programming, including a non-volatile field programmable gate array having a complementary metal-oxide semiconductor (CMOS)-type memory unit to drive next-stage logic gates. Non-volatile should be understood to mean that data stored in the non-volatile memory device/cell can be retained even when the device is not electrically powered. Non-volatile memory devices may be implemented using magnetic, optical, and/or other types of storage mediums.

With reference to FIGS. 1 through 4, apparatuses and methods of using the same are collectively described below. It is understood that additional steps can be provided before, during, and after the methods and some of the steps described below can be replaced or eliminated, for additional embodiments of the method. It is further understood that additional features can be added in the apparatuses and some of the features described below can be replaced or eliminated, for additional embodiments of the apparatuses. The present embodiments of the apparatuses and methods of using the same provide a non-volatile field programmable gate array having a complementary metal-oxide semiconductor-type memory unit replacing conventional static random access memory. In other words, data in each non-volatile memory cell pair should be complementary and function like CMOS device arrays. Complementary memory cells may be in the form of PMOS and NMOS transistors. In an embodiment, it is contemplated that the non-volatile memory may be constructed using a float gate or other dielectric film, such as SiN or other material. In an embodiment, programming (PGM) and erasing (ERS) of the memory device may easily be performed using a low power consumption Fowler-Nordheim (FN) tunneling current. It should be clear to a person having ordinary skill in the art that replacing a SRAM memory unit with a CMOS-type memory unit to drive next stage logic gates will maintain desirable speed and other features of the random access memory, without losing data when the device is powered down. In an embodiment, packaging costs may be reduced because the memory may be embedded into an FPGA chip.

It is well known that traditional FPGAs include fast, volatile memory using SRAM memory blocks. In an embodiment, the present disclosure replaces the traditional SRAM memory blocks with complementary CMOS memory blocks. As such, an embodiment of the disclosure relates to using non-volatile memory in the form of complementary CMOS memory units in an FPGA. An FPGA is an array of logic cells interconnected together where each logic cell may have a universal function, such as functioning as a complete logic device. FPGAs can be programmed to perform desired functions. FPGAs can generally be used to implement any logical function that an application specific integrated circuit (ASIC) could perform, but the FPGA has the ability to be updated or otherwise re-programmed. Interconnections between the logic cells/logic blocks are generally programmable. These interconnections are of different types and several paths are possible between selected points in the circuit. In addition, input/output cells may be programmable to show storage element, direction of information, and electrical level. As should be understood, FPGA logic blocks can generally be programmed to implement a multiple combinational logic circuit where the outputs of one logic block can be used as the inputs to other logic blocks.

Random access memory (RAM) is traditionally known to be volatile by losing data stored on the memory when the memory is not electrically powered. However, as discussed throughout this disclosure, using CMOS-type memory units will allow for a non-volatile RAM. RAM is a solid-state memory device that allows reading and writing of data to individual memory locations. The memory cells are generally arranged in an array of memory cells forming rows and columns. As such, each memory cell in the array forms an intersection between the rows and columns. Any individual memory cell in the array is defined by the address of one row and one column because each row and each column intersect only once. Each cell can generally store one bit of information. To retrieve information from a particular location in the RAM, the address codes of the row and column are specified. The output of this location is sampled by a suitable sensing device that is coupled with each row and each column. Consequently, the rows are termed bit lines and the columns are termed word lines. In an embodiment, the terms for the bit lines and the word lines may be reversed. Random is generally known in the art to mean that locations in the memory can be written to or read from in any order, regardless of the memory location that was last accessed.

Complementary metal-oxide semiconductor (CMOS) devices are integrated circuit devices that generally use complementary-symmetry. Complementary-symmetry means that the CMOS devices generally include complementary and symmetrical pairs of p-type and n-type metal-oxide-semiconductor field-effect transistors (MOSFETs) to perform logic functions. CMOS devices have a low static power consumption because significant power is only used when the transistors in the CMOS device are switching between on and off states. As a result, CMOS devices are desirable because they do not produce large amounts of waste when compared to other forms of logic devices, such as transistor-transistor logic (TTL) or NMOS logic. The small size of CMOS devices allows for a high density of logic devices on a single IC chip. The phrase metal-oxide-semiconductor generally relates to the physical structure of certain field-effect transistors that have a gate electrode placed on top of an oxide insulator, which in turn is on top of a semiconductor material. Aluminum, polysilicon, high-k materials, as well as other materials may be used. As should be understood, many of millions or more p-type and n-type transistors may be constructed on a substrate of silicon or other suitable material to create a CMOS device chip/die.

In operation, CMOS devices operate as logic gates using the p-type and n-type metal-oxide-semiconductor field-effect-transistors to create paths to the output from either an electrical voltage source or an electrical ground. When a path to output is created from the voltage source, the circuit is said to be pulled up, thus representing a digital 1 or "on" state. On the other hand, when a path to output is created from the electrical ground, the circuit is said to be pulled down, thus representing a digital 0 or "off" state.

FIG. 1 illustrates a schematic view of an embodiment of a non-volatile field programmable gate array (NV-FPGA) 100 having a complementary metal-oxide semiconductor (CMOS)-type memory unit 102. In an embodiment, the gate array 100 shown in FIG. 1 is driven by the CMOS-type memory unit 102. The CMOS-type memory unit 102 may be incorporated into a configurable RAM (C-RAM) to replace the conventional SRAM memory unit (e.g., usually 4-T SRAM). As can be seen, the CMOS-type memory unit 102 is a CMOS-type non-volatile memory (C-NVM). The C-NVM memory unit 102 includes complementary bit lines VBL 104 and /VBL 106. In use, an embodiment of the disclosure will couple the bit lines VBL 104 and /VBL 106 to a complementary Vcc voltage source (e.g., VBL 104) and a ground (e.g., /VBL 106), respectively. The C-NVM memory unit 102 also includes complementary word lines VWL 108 and /VWL 110. In an embodiment, the word lines VWL 108 and /VWL 110 are coupled to a complementary Vcc voltage source and a ground, respectively. For example, VWL 108 is coupled to Vcc and /VWL 110 is coupled to ground. As such, complementary data can be stored on the word line VWL 108 and the word line /VWL 110.

The C-NVM memory unit 102 provides an output signal/value at a C-NVM output node 112. As described above, with respect to other CMOS devices, the C-NVM output node 112 value may be operable to provide output values of 0 or 1. In an embodiment, at a reading of the C-NVM memory unit 102, the bit line VBL 104 will be approximately 1.45 volts and the bit line /VBL 106 will be approximately 0 volts. As such, the data value of 0 will be approximately 0 volts and the data value of 1 will be approximately 1.45 volts. However, it should be understood that other values may be provided to the bit lines VBL 104 and /VBL 106 and also to the word lines VWL 108 and /VWL 110. The C-NVM output node 112 also includes a clear reset device 114. The C-NVM clear reset device 114 is used to reset the value of the C-NVM output node 112. The clear reset device 114 may be a metal-oxide semiconductor field-effect transistor (MOSFET). However, other types of switch-type devices may be used for the clear reset 114.

In the NV-FPGA 100, the C-NVM output node 112 is coupled to a number of routing pass gates 116, 118, and 120. Any number of pass gates 116, 118, and 120 may be used. As should be understood by one having ordinary skill in the art, the routing pass gates 116, 118, and 120 are used typically to improve speed for the NV-FPGA 100. As can be seen in FIG. 1, an embodiment provides that the routing pass gates 116, 118, and 120 utilize routing signals 117, 119, and 121, respectively. The routing signals 117, 119, and 121 are, in an embodiment, approximately 0.9 volts. However, other values may be used for the routing signals 117, 119, and 121. Also, in an embodiment, the routing signals 117, 119, and 121 are controlled by the C-NVM output node 112.

Figure 2:
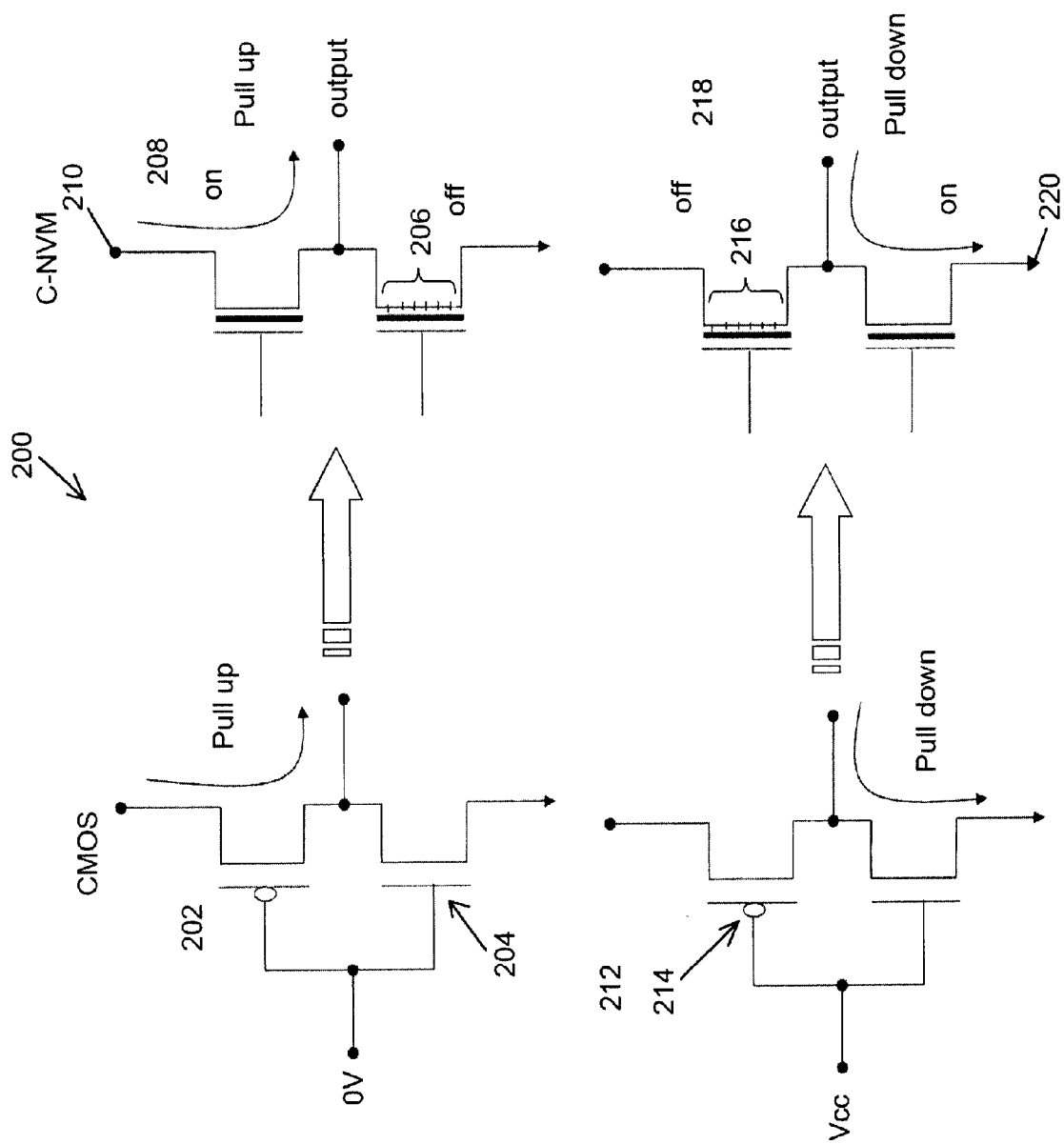
FIG. 2 illustrates a method for programming an integrated circuit device according to aspects of the present embodiments.

FIG. 2 illustrates a schematic view of an embodiment of a programming system 200 for a C-NVM memory unit (e.g., C-NVM memory unit 102). The C-NVM memory unit, such as the C-NVM memory unit 102 of FIG. 1, may essentially function as a CMOS device, and in some embodiments, may adopt CMOS inverter (i.e., comprising an NMOS device and a PMOS device) operation theory. As such, the C-NVM memory unit may be able to store digital data in the form of a 1 or a 0. FIG. 2 illustrates a pull-up and pull-down model of a CMOS inverter and a C-NVM memory unit. Referring to the CMOS inverter, a pull-up model 202 and pull-down model 212 is illustrated. In the pull-up model 202, when a ground condition is applied to the gate (i.e., 0 volts), the PMOS device is on and the NMOS device is off, resulting in a value of 1 (e.g., Vcc) being charged to the output node of the CMOS inverter. In the pull-down model 212, when a voltage is applied to the gate (i.e., Vcc), the PMOS device is off and the NMOS device is on, resulting in a potential of output node being discharged to 0 volts (ground). The C-NVM memory unit may function similarly to the CMOS inverter in the pull-up and pull-down models, such as the logical operation. For example, the pull-up model 208 for the C-NVM will pass a value substantially that of a voltage source coupled at 210 at the output when transistor 206 is programmed (i.e., off). Conversely, the pull-down model 218 for the C-NVM will pass a value substantially that of a ground coupled at 220 at the output when transistor 216 is programmed (i.e., off).

Figure 3:
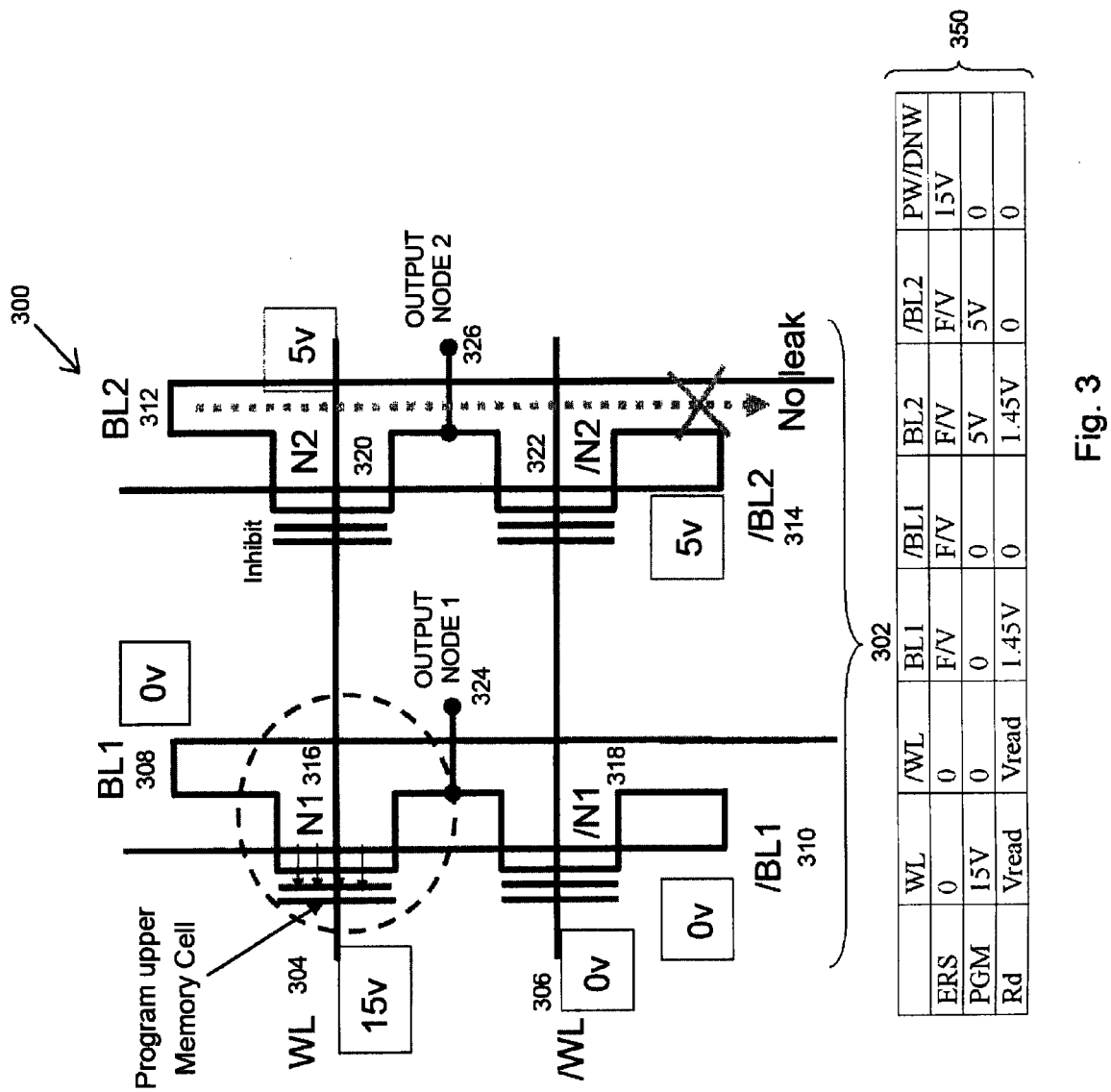
FIG. 3 illustrates a method for programming an integrated circuit device according to aspects of the present embodiments.

FIG. 3 illustrates a schematic view of an embodiment of a programming system 300 for a C-NVM memory unit array 302. In this embodiment, the C-NVM memory unit array 302 includes CMOS-type devices to provide non-volatile memory. As shown, the C-NVM memory unit array 302 has word complementary word lines WL 304 and /WL 306. In an embodiment, the word line 304 is coupled to a 15 volts voltage supply and the word line /WL 306 is coupled to ground or 0 volts. However, it should be understood that different voltage values may be used at the word lines WL 304 and /WL 306. The C-NVM memory unit array 302 also includes bit lines BL1 308, /BL1 310, BL2 312, and /BL2 314. Cell N1 316 is at the junction of WL 304 and BL1 308. Cell /N1 318 is at the junction of /WL 306 and /BL1 310. Cell N2 320 is at the intersection of WL 304 and BL2 312. Cell /N2 322 is at the junction of /WL 306 and /BL2 314. Thus, outputs for the C-NVM memory unit array 302 are found at output node 1 324 and output node 2 326.

A chart 350 provides values for an example of a programming of the C-NVM memory unit array 302. It should be understood that other values may be used for programming the C-NVM memory unit array 302. In operation, the erasing (ERS) and programming (PGM) of the C-NVM memory unit array 302 starts by erasing. In the ERS condition, p-well (PW) and deep n-well (DNW) regions of an integrated circuit device may be coupled to a positive high voltage (e.g., 15 volts), the word lines (i.e., WL and/or /WL) may be coupled to a ground (e.g., 0 volts), and the bit lines (i.e., BL1, /BL1, BL2, and/or /BL2) may be floating (e.g., not connected or coupled to a voltage source or ground). Meanwhile, the electrons in a storage material may be pulled out by FN current. This may cause the transistor memory cell to become low (normally on). It should be readily understood that the erase current is very small, resulting in saving power for the C-NVM memory unit array 302. The ERS block (e.g., erasing a block of memory) may clear a page, a sector, a block, and/or a whole chip.

The memory cells may constitute a page. For example, the four memory cells may be defined as a page. In some embodiments, the page of memory cells may be programmed together simultaneously. In some embodiments, the page of memory cells may be partially programmed, wherein the programming of selected memory cells is inhibited, and selected memory cells are programmed individually.

In the present example, an upper page (i.e., upper memory cell, N1 316) comprising BL1 308 is programmed. Referring to chart 350, for N1 316, the word line WL 304 is set to 15 volts and bit line BL1 308 is set to 0 volts. Accordingly, in this example, for /N1 318, the word line /WL 306 is set to 0 volts and the bit line /BL1 310 is set to 0 volts. Consequently, given that N2's 320 word line WL 304 is set to 15 volts, to inhibit an E-field in N2 320, bit line BL2 312 is set to 5 volts. Similarly, bit line /BL2 314 is set to 5 volts to improve suppression of leakage from BL2 312 to /BL2 314 to reduce power losses. As shown in the chart 350, bit lines BL1 308, /BL1 310, BL2 312 and /BL2 314 may be erased (ERS) when the word lines WL 304 and /WL 306 are set to 0 volts and the bit lines BL1 308, /BL1 310, BL2 312, and /BL2 314 are floating (e.g., not-connected (NC)) and p-well/deep n-well regions are connected to 15 volts, which cells are erased by using Fowler-Nordheim (FN) tunneling under such biases. It should be readily understood by a person having ordinary skill in the art that other values and sequences may be used for erasing (ERS), programming (PRG), and/or reading (Rd) the memory cells of the C-NVM memory unit array 302.

Non-volatile memory devices may be based on what is known in the art as floating gate transistors. The memory state of a gate cell is typically determined by the concentration of charge on the gate. The operation of the memory is dependent on the techniques used for injecting or removing charge from the gate. There are at least two common systems utilized for moving charge into and out of gates of memory cells in memory devices. One system is referred to as hot electron injection. Hot electron injection is induced by applying a positive voltage between the drain and source of the memory cell, and a positive voltage to the control gate. This induces a current in the cell, and hot electrons in the current are injected through the tunnel oxide of the gate cell into the gate. Hot electron injection is typically a fast operation requiring a high current. Therefore, this may be limited to use for programming a few cells at a time in the device. Another system for moving charge into and out of the gates of memory cells is referred to as Fowler-Nordheim (FN) tunneling, as shown in the chart 350 of FIG. 3. FN tunneling may be induced by establishing a large electric field between the control gate and one of the drain, source, and channel or between the control gate and a combination of these nodes. The electric field establishes an FN tunneling current through the tunnel oxide and can be used for both injecting electrons into the gate, and driving electrons out of the gate. The FN tunneling process is typically a low-current operation, because it does not involve a current flowing between the source and drain of the cells. Thus, FN tunneling may be used in parallel across a number of cells simultaneously on a device. As such, FN tunneling may be used for pre-programming or erasing a memory device, such as the C-NVM memory unit array 302. Operation of memory generally involves programming the array using a cell-by-cell control of the amount of charge stored in the gates, using bit lines and word lines, and erasing, where an entire array or a sector of the array may be cleared to a predetermined charge state in the gates. In an embodiment, FN tunneling may be used for programming and for erasing memory cells in the array. In an embodiment, hot electron injection may be used for programming and FN tunneling may be used for erasing.

Typically, to ensure a more uniform distribution of charge in erased memory cells, a pre-programming sequence may be performed so that all cells in a memory block to be erased, are pre-programmed to a known state, such as a high threshold state, prior to applying the erasing potentials. In this way, when the memory array is erased, all of the memory cells will start with substantially the same amount of charge in the gates. Thus, the erasing sequence provides more uniform charge levels across the entire memory block.

Figure 4:
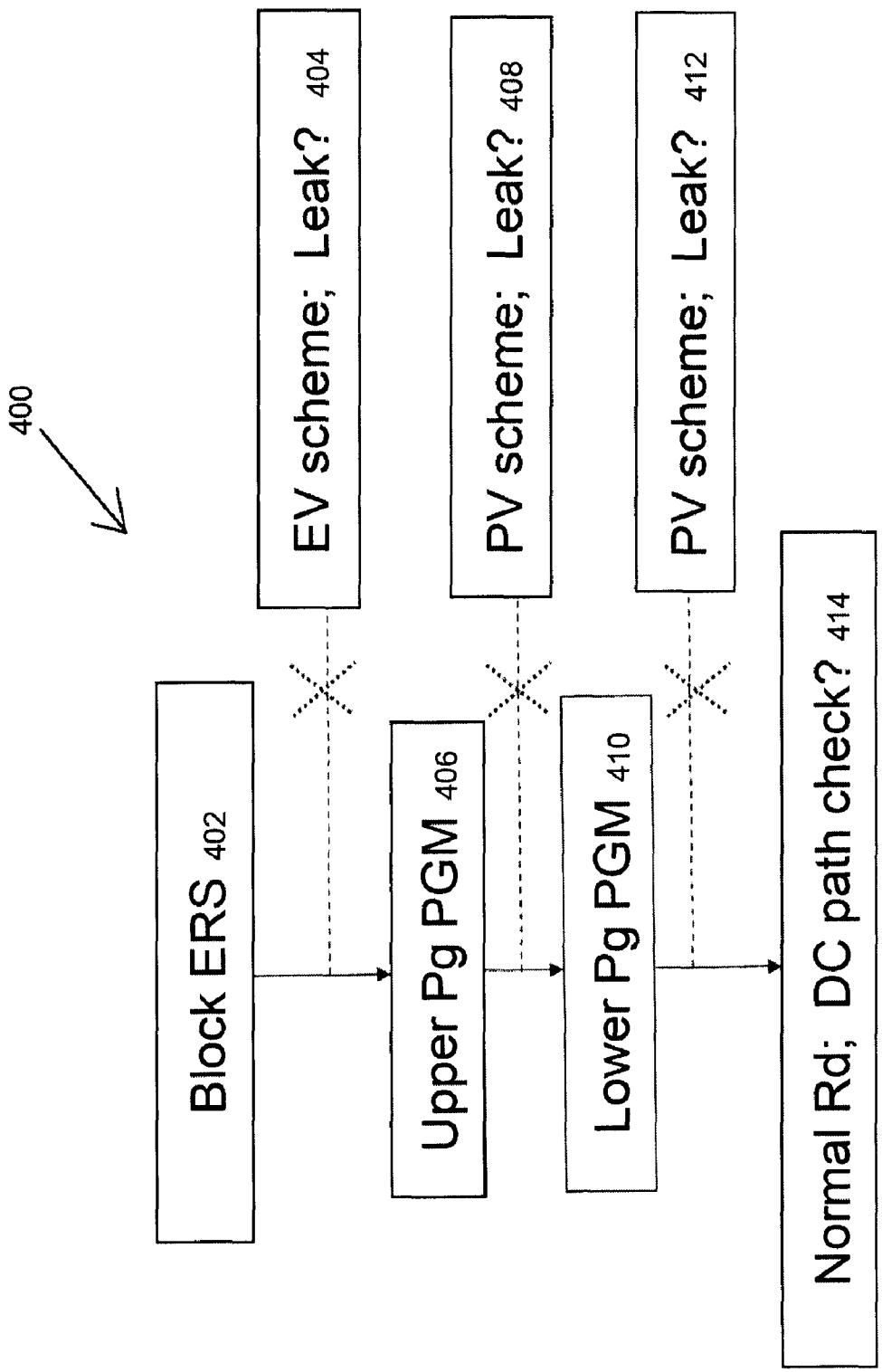
FIG. 4 illustrates a method for programming an integrated circuit device according to aspects of the present embodiments.

FIG. 4 illustrates a flow chart of an embodiment of a programming method 400 for a CMOS-type memory unit (e.g., C-NVM memory unit 102). To program or erase the memory unit, an information handling system (IHS) is coupled to the memory unit for communicating between the IHS and the memory unit (e.g., C-NVM memory unit 102). The method 400 begins at block 402 where the method 400 performs a block erase (ERS) of the C-NVM memory unit. The block erase (ERS) of the C-NVM memory unit may be performed by FN tunneling or by other methods. After the method 400 performs the block erase (ERS) at block 402, the method 400 performs an erase verify at block 404. The erase verify confirms that the memory cells for the C-NVM memory unit are properly erased and set to adequate charge levels. In addition, the method 400 may perform a test in block 404 to determine whether there is an unacceptable level of leakage current in the C-NVM memory unit. As shown in FIG. 3, leakage current may be suppressed, for example, by coupling /BL2 to a voltage source of 5 volts. If the method 400 determines that the erase verify at block 404 fails, the method 400 will return to block 402 to re-perform the erase routine. If the method 400 determines that there is an unacceptable level of leakage current, the method 400 ends and notifies the user.

On the other hand, if the method 400 determines that the erase verify and the leak check of block 404 are acceptable, the method 400 then proceeds to block 406 to program (PGM) the upper page (e.g., upper memory unit/cell) of the C-NVM memory unit. After the method 400 performs the upper page program (PGM) at block 406, the method 400 performs a program verify at block 408. The program verify confirms that the memory cells for the upper page are properly programmed and set to adequate charge levels. In addition, the method 400 may perform a test in block 408 to determine whether there is an unacceptable level of leakage current in the C-NVM memory unit. If the method 400 determines that the program verify at block 408 fails, the method 400 will return to block 406 to re-perform the program upper page (PGM) routine. If the method 400 determines that there is an unacceptable level of leakage current, the method 400 ends and notifies the user.

If the method 400 determines that the program upper page verify and the leak check of block 408 are acceptable, the method 400 then proceeds to block 410 to program (PGM) the lower page (e.g., lower memory cell) of the C-NVM memory unit. After the method 400 performs the lower page program (PGM) at block 410, the method 400 performs a program verify at block 412. The program verify confirms that the memory cells for the lower page are properly programmed and set to adequate charge levels. In addition, the method 400 may perform a test in block 412 to determine whether there is an unacceptable level of leakage current in the C-NVM memory unit. If the method 400 determines that the program verify at block 412 fails, the method 400 will return to block 410 to re-perform the program lower page (PGM) routine. If the method 400 determines that there is an unacceptable level of leakage current, the method 400 ends and notifies the user. If the method 400 determines that the program verify and the leak check of block 412 are acceptable, the method 400 then proceeds to block 414 to allow normal reading (Rd) and DC path checking of the memory cells in the C-NVM memory unit.

Features of the foregoing should be readily apparent to those having ordinary skill in the art include, but are not limited to: manufacturing the C-NVM memory devices described above may be performed using multiple layers and wells on a substrate to create the n-type and p-type transistors for the memory devices. Various PGM/ERS transient curves, current per cell, endurance, memory cell drain current (Id), memory cell gate voltage (Vg), memory cell voltage threshold (Vt), memory cell drain voltage (Vd), Vt window (with an assumption of no PV (i.e., a signal which is activated when a verifying operation is performed in the writing operation) and/or EV (i.e., a signal which is activated at the time of performing the verifying operation in the erasing operation) within an error correction code (ECC)) may be realized with different embodiments. It should also be understood that non-volatile memory having pair CMOS-like functionality having complementary data in data cell pairs may be used to drive next-stage logic gates. It should also be understood that Fowler-Nordheim programming (PGM) and erasing (ERS) may be used to code memory data using low power consumption.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A non-volatile memory device comprising:
   a first complementary metal-oxide-semiconductor (CMOS) device coupled to a bit line and a word line;
   a second CMOS device coupled to the first CMOS device, a complementary bit line and a complementary word line, wherein the first and second CMOS devices are complementary to one another; and an output node coupled between the first CMOS device and the second CMOS device.

2. The memory device of claim 1, further comprising: a reset switch coupled to the output node, between the output node and an electrical ground.

3. The memory device of claim 1, wherein the output node registers a digital data value of 0 or 1, and wherein the value of 0 is substantially 0 volts and the value of 1 is substantially 1.45 volts.

4. The memory device of claim 1, further comprising: one or more routing pass gates coupled to the output node.

5. The memory device of claim 4, wherein the one or more routing pass gates operate using a routing control signal of approximately 0.9 volts.

6. The memory device of claim 1, wherein a digital value of 1 is provided to the output node due to a pull-up configuration of the memory device and a digital value of 0 is provided to the output node due to a pull-down configuration of the memory device.

7. The memory device of claim 6 wherein the digital value of 1 is achieved by programming the second CMOS device and the digital value of 0 is achieved by programming the first CMOS device.

8. An integrated circuit device including a field programmable gate array, the field programmable gate array comprising:
a plurality of logic cells arranged in rows and columns, each of the logic cells provided to perform one or more logic functions;
a memory unit coupled to at least one of the plurality of logic cells, the memory unit having a first metal-oxide semiconductor device and a second metal-oxide semiconductor device; and
an output node coupled to the memory unit, further comprising:
a bit line and a word line coupled to the first metal-oxide-semiconductor device; and
a complementary bit line and a complementary word line coupled to the second metal-oxide-semiconductor device.

9. An integrated circuit device including a field programmable gate array, the field programmable gate array comprising:
a plurality of logic cells arranged in rows and columns, each of the logic cells provided to perform one or more logic functions;
a memory unit coupled to at least one of the plurality of logic cells, the memory unit having a first metal-oxide semiconductor device and a second metal-oxide semiconductor device; and
an output node coupled to the memory unit, further comprising:
a reset switch coupled to the output node, between the output node and an electrical ground.

10. An integrated circuit device including a field programmable gate array, the field programmable gate array comprising:
a plurality of logic cells arranged in rows and columns, each of the logic cells provided to perform one or more logic functions;
a memory unit coupled to at least one of the plurality of logic cells, the memory unit having a first metal-oxide semiconductor device and a second metal-oxide semiconductor device; and
an output node coupled to the memory unit, wherein the output node registers a digital data value of 0 or 1, and wherein the value of 0 is substantially 0 volts and the value of 1 is substantially 1.45 volts.

11. The integrated circuit device of claim 8, further comprising:
one or more routing pass gates coupled to the output node.

12. An integrated circuit device including a field programmable gate array, the field programmable gate array comprising:
a plurality of logic cells arranged in rows and columns, each of the logic cells provided to perform one or more logic functions;
a memory unit coupled to at least one of the plurality of logic cells, the memory unit having a first metal-oxide semiconductor device and a second metal-oxide semiconductor device; and
an output node coupled to the memory unit, wherein a digital value of 1 is provided to the output node due to a pull-up configuration of the memory device and a digital value of 0 is provided to the output node due to a pull-down configuration of the memory device.

* * * * *